US009535326B2

(12) United States Patent
Park et al.

(10) Patent No.: US 9,535,326 B2
(45) Date of Patent: Jan. 3, 2017

(54) METHODS OF MANUFACTURING A SEMICONDUCTOR DEVICE

(71) Applicant: Samsung Electronics Co., Ltd., Suwon-si, Gyeonggi-do (KR)

(72) Inventors: Jeong Ju Park, Hwaseong-si (KR); Kyoungmi Kim, Anyang-si (KR); Jaeho Kim, Yongin-si (KR); Jungsik Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 14/620,289

(22) Filed: Feb. 12, 2015

(65) Prior Publication Data
US 2015/0227046 A1 Aug. 13, 2015

(30) Foreign Application Priority Data
Feb. 12, 2014 (KR) .................. 10-2014-0016081

(51) Int. Cl.
*G03F 7/26* (2006.01)
*G03F 7/16* (2006.01)
*H01L 21/027* (2006.01)
*G03F 7/30* (2006.01)
*H01L 21/033* (2006.01)

(52) U.S. Cl.
CPC .............. *G03F 7/168* (2013.01); *G03F 7/30* (2013.01); *H01L 21/0276* (2013.01); *H01L 21/0337* (2013.01)

(58) Field of Classification Search
CPC ....................................................... G03F 7/40
See application file for complete search history.

(56) References Cited

U.S. PATENT DOCUMENTS

| 7,763,319 B2 | 7/2010 | Cheng et al. |
| 7,901,866 B2 | 3/2011 | Ito |
| 7,976,715 B2 | 7/2011 | Dobisz et al. |
| 7,989,026 B2 | 8/2011 | Cheng et al. |
| 8,147,914 B2 | 4/2012 | Jung et al. |
| 8,226,838 B2 | 7/2012 | Cheng et al. |
| 8,247,033 B2 | 8/2012 | Russell et al. |
| 8,263,323 B2 | 9/2012 | Yoon et al. |
| 8,273,668 B2 | 9/2012 | Yoon et al. |
| 8,623,458 B2 | 1/2014 | Cheng et al. |
| 2011/0014420 A2 | 1/2011 | Gopalan et al. |

(Continued)

FOREIGN PATENT DOCUMENTS

KR   10-2010-0079948 A   7/2010

*Primary Examiner* — Kathleen Duda
(74) *Attorney, Agent, or Firm* — Myers Bigel, P.A.

(57) ABSTRACT

The inventive concepts provide methods of forming a semiconductor device. The method includes forming a neutral layer having a photosensitive property and a reflow property on an anti-reflective coating layer, performing an exposure process and a development process on the neutral layer to form a preliminary neutral pattern at least partially exposing the anti-reflective coating layer, heating the preliminary neutral pattern to form a neutral pattern, forming a block copolymer layer on the neutral pattern, and heating the block copolymer layer to form a block copolymer pattern. The block copolymer pattern includes a first pattern disposed on the anti-reflective coating layer exposed by the neutral pattern, and a second pattern disposed on the neutral pattern and chemically bonded to the first pattern.

20 Claims, 14 Drawing Sheets

(56) References Cited

U.S. PATENT DOCUMENTS

| | | |
|---|---|---|
| 2011/0039061 A1 | 2/2011 | Fedynyshyn et al. |
| 2011/0147985 A1* | 6/2011 | Cheng .................. G03F 7/0392 264/225 |
| 2012/0164389 A1 | 6/2012 | Yang et al. |
| 2012/0202017 A1 | 8/2012 | Nealey et al. |

* cited by examiner

METHODS OF MANUFACTURING A SEMICONDUCTOR DEVICE

CROSS-REFERENCE TO RELATED APPLICATION

This U.S. non-provisional patent application claims priority under 35 U.S.C. §119 to Korean Patent Application No. 10-2014-0016081, filed on Feb. 12, 2014, the disclosure of which is hereby incorporated by reference in its entirety.

FIELD

The inventive concepts relate to methods of manufacturing a semiconductor device and, more particularly, to methods of manufacturing a semiconductor device having fine patterns.

BACKGROUND

Semiconductor devices are widely used in the electronic industry at least because of their small size, multi-function and/or low manufacturing costs. Semiconductor devices may include semiconductor memory devices storing logical data, semiconductor logic devices processing logical data, and hybrid devices capable of performing various functions.

Semiconductor devices have been highly integrated with the development of the electronic industry. Thus, manufacture of semiconductor devices has been more and more difficult at least in view of various problems such as reduction of a process margin of a photolithography process defining fine patterns. In addition, high-speed semiconductor devices have been increasingly in demand with the development of the electronic industry.

SUMMARY

Embodiments of the inventive concepts may provide methods of manufacturing a highly integrated semiconductor device.

In an aspect, the method may include: forming a neutral layer on an anti-reflective coating layer, the neutral layer having a photosensitive property and a reflow property; performing an exposure process and a development process on the neutral layer to form a preliminary neutral pattern partially exposing the anti-reflective coating layer; heating the preliminary neutral pattern to form a neutral pattern; forming a block copolymer layer on the neutral pattern; and heating the block copolymer layer to form a block copolymer pattern comprising: a first pattern disposed on the anti-reflective coating layer exposed by the neutral pattern; and a second pattern disposed on the neutral pattern and covalently bonded to the first pattern.

In some embodiments, a width of the anti-reflective coating layer exposed by the preliminary neutral pattern may be n times a length of one block copolymer included in the block copolymer layer, where "n" is an integer of 2 or more.

In some embodiments, a width of the anti-reflective coating layer exposed by the neutral pattern may be 50% of a length of one block copolymer included in the block copolymer pattern.

In some embodiments, a light source of the exposure process may use ArF, ArF immersion (ArFi), or extreme ultraviolet (EUV).

In some embodiments, forming the neutral layer may include: coating a neutral layer including a cross linker; and baking the neutral layer. Cross-linked bonds may be formed in the neutral layer when the neutral layer is baked. The cross-linked bonds may be broken in a portion, exposed during the exposure process, of the neutral layer, and the portion, in which the cross-linked bonds are broken, of the neutral layer may be removed during the development process.

In some embodiments, cross-linked bonds may be formed in the preliminary neutral pattern while the preliminary neutral pattern is heated.

In some embodiments, the neutral layer may include: polystyrene (PS); polymethylmethacrylate (PMMA); a solvent; a photo acid generator (PAG); and a cross linker.

In some embodiments, each of the polystyrene (PS) and polymethylmethacrylate (PMMA) may include at least one end group selected from a group consisting of a leaving group, a cross-linking site, a hydrophobic group, and a hydrophilic group.

In some embodiments, the neutral pattern may include a plurality of neutral patterns having linear shapes extending in a first direction. The plurality of neutral patterns may be spaced apart from each other in a second direction perpendicular to the first direction.

In some embodiments, the neutral pattern may include a plurality of holes exposing the anti-reflective coating layer.

In some embodiments, the first pattern may include polymethylmethacrylate (PMMA), the second pattern may include polystyrene (PS), and the anti-reflective coating layer may include at least one of silicon (Si), titanium (Ti), zirconium (Zr), or tungsten (W).

In some embodiments, the neutral pattern may include PMMA and PS randomly mixed with each other.

In some embodiments, the block copolymer pattern may further include: a third pattern disposed on the neutral pattern and including the PMMA; and a fourth pattern disposed on the neutral pattern and including the PS. The fourth pattern may be covalently bonded to the third pattern, and the third and fourth patterns may be alternately formed.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
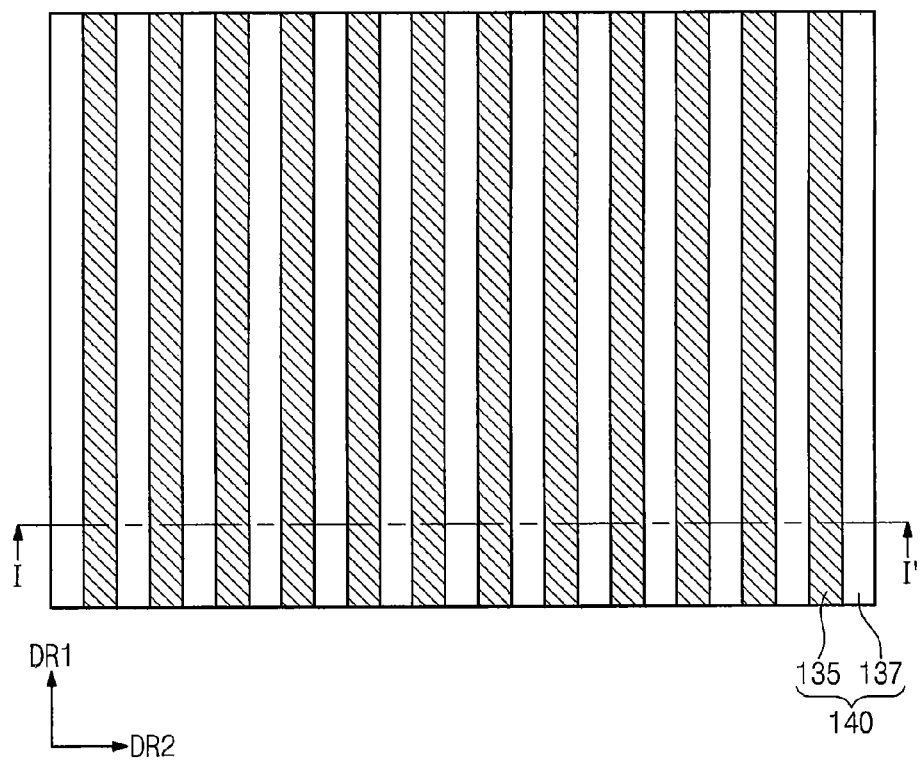
FIGS. 1A and 1B are a plan view and a cross-sectional view illustrating a semiconductor device according to some embodiments of the inventive concepts, respectively.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
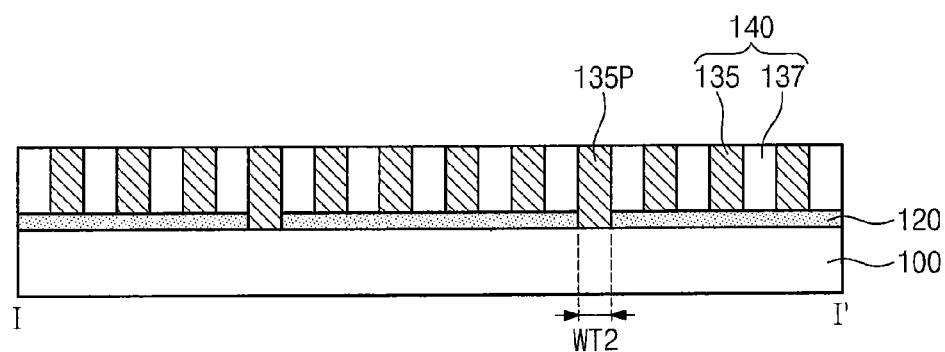

FIG. 1A is a plan view illustrating a pattern structure according to some embodiments of the inventive concepts, and FIG. 1B is a cross-sectional view taken along a line I-I' of FIG. 1A.

Referring to FIGS. 1A and 1B, a pattern structure may include an anti-reflective coating (ARC) layer 100, a neutral pattern 120 exposing a portion of the anti-reflective coating layer 100, and a block copolymer pattern (BCP) 140 disposed on the neutral pattern 120.

The block copolymer pattern 140 may use a directed self-assembly phenomenon. In other words, the block copolymer pattern 140 may include two polymers that have chemical properties different from each other and are covalently bonded to each other. Thus, a micro-phase separation phenomenon may spontaneously occur in the block copolymer pattern 140. As a result, nano structures of about 5 nm to about 50 nm corresponding to a polymer size may be formed in the block copolymer pattern 140.

According to some embodiments of the inventive concepts, the block copolymer pattern 140 may include polymethylmethacrylate-b-polystyrene (PMMA-b-PS) having polymethylmethacrylate (PMMA) and polystyrene (PS) which are covalently bonded to each other. Hereinafter, for the purpose of ease and convenience in explanation, a portion, which is formed of PMMA, of the block copolymer pattern 140 is defined as a first pattern 135 and another portion, which is formed of PS, of the block copolymer pattern 140 is defined as a second pattern 137. The first pattern 135 and the second pattern 137 may be covalently bonded to each other. The block copolymer pattern 140 may include a plurality of first patterns 135 and a plurality of second patterns 137 which are alternately arranged.

The anti-reflective coating layer 100 may prevent light from being reflected during a process using light, such as a photolithography process. According to some embodiments of the inventive concepts, the anti-reflective coating layer 100 may include a material having an affinity for the material included in the first pattern 135 of the block copolymer pattern 140. Accordingly, the material having a high affinity for the material included in the first pattern 135 of the block copolymer pattern 140 may have similar chemical properties. In some embodiments, the anti-reflective coating layer 100 may include an organic or inorganic compound having a high surface energy affinity with PMMA. For example, the anti-reflective coating layer 100 may include at least one of silicon (Si), titanium (Ti), zirconium (Zr), or tungsten (W).

In some embodiments, the anti-reflective coating layer 100 may have a singled-layered structure or a multi-layered structure. Even though not shown in the drawings, a lower structure may further be disposed under the anti-reflective coating layer 100.

The neutral pattern 120 may include a plurality of neutral patterns 120 having linear shapes extending in a first direction DR1. The plurality of neutral patterns 120 may be spaced apart from each other in a second direction DR2 perpendicular to the first direction DR1. A width WT2 of the anti-reflective coating layer 100 exposed between two neutral patterns 120 adjacent to each other may be 50% of a length $L_0$ of one block copolymer in the block copolymer pattern 140.

The neutral pattern 120 may include a material having a neutral affinity for two polymers of the block copolymer pattern 140. The neutral pattern 120 may include a material formed by randomly mixing PMMA and PS in the range of 1:1. In some embodiments, the neutral pattern 120 may include a material having a photosensitive property and a reflow property. As described in greater detail below.

As described above, the first pattern 135 of the block copolymer pattern 140 may include PMMA and the anti-reflective coating layer 100 may include the material having the greater affinity for PMMA. In this case, the first pattern 135 may be disposed on the anti-reflective coating layer 100 exposed between the two neutral patterns 120 having the linear shapes. The first pattern 135 disposed on the anti-reflective coating layer 100 exposed between the two neutral patterns 120 is defined as a pinning pattern 135P. In some embodiments, a width WT2 of the pinning pattern 135P may be 50% of the length $L_0$ of the one block copolymer in the block copolymer pattern 140. For example, the pinning pattern 135P may have a width of about 2 nm or less, and the neutral pattern 120 may have a thickness of about 10 nm or less.

As described above, the second pattern 137 of block copolymer pattern 140 may be covalently bonded to the first pattern 135 and may be disposed on the neutral pattern 120. Since the neutral pattern 120 has a neutral affinity for the materials included in the first and second patterns 135 and 137, respectively, the first patterns 135 and the second patterns 137, respectively, may be alternately disposed on the neutral pattern 120. In some embodiments, a width WT2 of each of the first patterns 135 and second patterns 137 may be 50% of the length $L_0$ of the one block copolymer in the block copolymer pattern 140. For example, each of the first patterns 135 and second patterns 137 may have a width of about 20 nm or less, and the neutral pattern 120 may have a thickness of about 10 nm or less.

One of the first patterns 135 and the second patterns 137 may be removed to form a pattern structure having a line-and-space structure. At this time, a width of each of the line and the space may be about 20 nm or less, so a fine pattern structure may be completed.

Hereinafter, the material included in the neutral pattern 120 will be described in more detail. Materials described below will be described as examples. However, the inventive concepts are not limited thereto.

The neutral pattern 120 may include a polymer resin, a photo acid group (PAG), a cross linker, and a solvent.

In some embodiments, the polymer resin may include a material formed by randomly mixing PMMA and PS in the range of 1:1. Each of the PMMA and the PS may include at least one end group selected from a group consisting of a leaving group, a cross linking site, a hydrophobic group, and a hydrophilic group.

The leaving group is decomposed when it is in contact with a species generated by photolysis of the PAG. The leaving group includes an acid-sensitive or acid-decomposable group that is decomposed by contact with a photolyzed acid to generate a moiety having basic solubility. The acid-sensitive or acid-decomposable group may include a phenol hydroxyl group or a carboxyl group.

A suitable acid-sensitive or acid-decomposable group bonded to carboxylate may include at least one of, but not limited to, vinyl ether (e.g., tert-butyl ester, 2,3-dimethylbutyl ester, 2-methylphenyl ester, 2,3,4-trimethylpentyl ester, alicyclic ester, —O—(CH(CH$_3$)OC$_2$H$_5$), or —O—(CH$_2$OC$_2$H$_5$), acetal or ketal formed from enol, or an alkyl group including four or more carbon atoms and at least one tetracarbon (e.g., tetrahydropyran (THP)) directly bonded to carboxylated oxygen. The alicyclic ester may include at least one of, but not limited to, adamantyl, methyladamantyl, ethyladamantyl, methylnorbornyl, ethylnorbornyl, ethyltrimethylnorbornyl, or ethyl fenchol.

A suitable acid-decomposable group bonded to the phenol hydroxyl group may include at least one of, but not limited to, acetal, ketal, THP, or tert-butoxycarbonyl.

The hydrophobic group may include alcohol and ether. For example, the hydrophobic group may include at least one of 2-propylene glycol, 1,2-butanediol, 1,2-pentanediol-1,2-hexanediol, 1,2-decanediol, glycidyl isobutyl ether, glycidyl isopropyl ether, or glycidyl hexadecyl ether.

The hydrophilic group may include at least one of a carbonyl group, ester group (—COOR), alcoholic hydroxyl group, imino group, or amino group.

The cross linker may include a multi-functional ethylene unsaturated monomer. For example, the cross linker may include at least one of, but not limited to, trivinylbenzene, divinyltoluene, divinylpyridine, divinylnaphthalene, divinylxylene, ethylene glycol diacrylate, trimethylolpropane triacrylate (TMPTA), diethylene glycol divinyl ether, trivinylcyclohexane, ally methacrylate (ALMA), ethylene glycol dimethacrylate (EGDMA), diethylene glycol dimethacrylate (DEGDMA), prophylene glycol dimethacrylate, prophylene glycol diacrylate, trimethylolpropane trimethacrylate (TMPTMA), divinyl benzene (DVB), glycidyl methacrylate, 2,2-dimethylpropane diacrylatae, 1,3-butylene glycol diacrylate, 1,3-butylene glycol dimethacrylate, 1,4-butandiol diacrylate, diethylene glycol diacrylate, diethylene glycol dimethacrylate, 1,6-hexanediol diacrylate, 1,6-hexanediol dimethacrylate, triprophylene glycol diacrylate, triprophylene glycol dimethacrylate, tetraethylene glycol diacrylate, tetraethylene glycol dimethacrylate, ethoxylated bisphenol A diacrylate, ethoxylated bisphenol A dimethacrylate, pentaerythritol triacrylate, trimethylolprophane triethoxy triacrylate, glyceryl propoxy triacrylate, pentaerythritol tetracrylate, pentaerythritol tetramethacrylate, pentaerythritol monohydroxypentacrylate, ethoxylated diacrylate, ethoxylated triacrylate, ethoxylated TMPTA, ethoxylated TMPTMA, ethoxylated tetracrylate, divinyl silane, tirvinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, glycosyl urea including di-, tri- and tetra-glycosyl ureas, or epoxy.

The PAG may include triarylsulfonium salt, diarylionium salt, sulfonate, N-hydroxysuccinimide triflate, or any mixture thereof. For example, the PAG may include at least one of triphenylsulfonium triflate, triphenylsulfonium antimony salt, diphenyliodonium triflate, diphenyliodonium antimony salt, methoxydiphenyliodonium triflate, di-tert-butyldiphenyliodonium triflate, 2,6-dinitrobenzyl sulfonate, pyrogallol tris(alkylsufonate), norbornene-dicarboxyimide triflate, triphenylsufonium nonaflate, diphenyliodonium nonaflate, methoxydiphenyliodonium nonaflate, di-tert-butyldiphenyliodonium nonaflate, N-hydroxysuccinimide nonaflate, norbornene dicarboxyimide nonaflate, triphenylsulfonium perfluorooctanesulfonate, diphenyliodonium perfluorooctanesulfonate, methoxyphenyliodonium perfluorooctanesulfonate, di-tert-butyldiphenyliodonium triflate, N-hydroxysuccinimide perfluorooctanesulfonate, or norbornene dicarboxyimide perfluorooctanesulfonate. However, the inventive concepts are not limited to the aforementioned materials of the PAG.

The solvent may include at least one of, but not limited to, ethyleneglycolmonomethylether, ethyleneglycolmonoethylether, methylcellosolveacetate, ethylcellosolveacetate, diethyleneglycolmonomethylether, diethyleneglycolmonoethylether, propyleneglycolmethyletheracetate, propyleneglycolpropyletheracetate, diethyleneglycoldimethylether, ethyl lactate, toluene, xylene, methylethylketone, cyclohexanone, 2-heptanone, 3-heptanone, or 4-heptanone.

The neutral pattern 120 may further include a thermal acid generator (TAG) and a quencher.

The TAG may be decomposed at a high temperature (e.g., 100° C. or more) to release an acid, thereby accelerating a cross-linking reaction between the cross linker and the polymer resin containing the hydroxyl group or the carboxyl group. For example, The TAG may include at least one of 2,4,4,6-tetra-bromocyclohexadienon, benzoin tosylate, squaric acid, 2-nitrobenzyl tosylate, chloroacetic acid, toluene-sulfonic acid, methane-sulfonic acid, nonaflate acid, triflic acid, or salts of alkyl ester acids of other organic sulfonic acids.

The quencher may act on excited molecules having a luminescent property causing fluorescence and/or phosphorescence to remove excitation energy and may include a molecule capable of reducing or preventing the luminescent property.

As described above, since the neutral patterns 120 include materials (e.g., the polymer resin, the PAG, and the solvent) used in a photoresist, the neutral pattern 120 may have a photosensitive property. Thus, the neutral patterns 120 may be formed without a photoresist layer. As a result, formation processes of the neutral patterns 120 may be simplified.

Figure 2A:
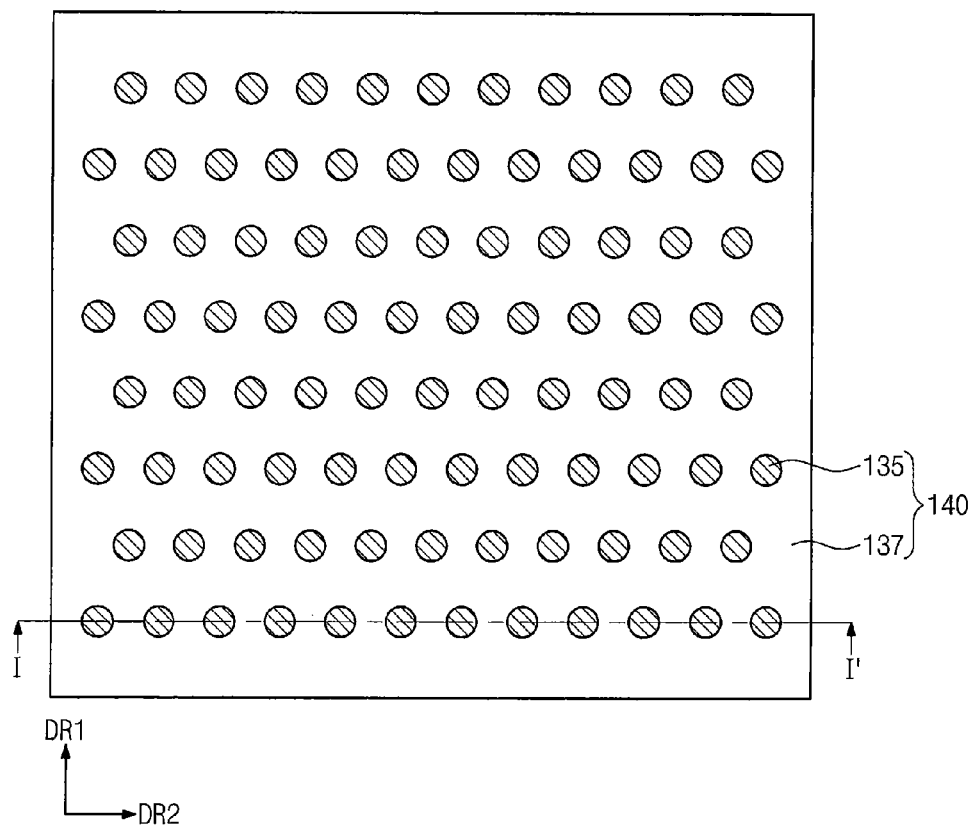
FIGS. 2A and 2B are a plan view and a cross-sectional view illustrating a semiconductor device according to other embodiments of the inventive concepts, respectively.
Figure 2B:
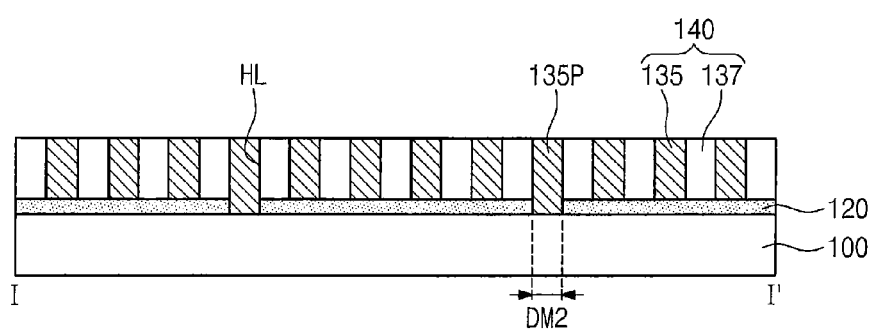

FIG. 2A is a plan view illustrating a pattern structure according to other embodiments of the inventive concepts, and FIG. 2B is a cross-sectional view taken along a line I-I' of FIG. 2A.

Referring to FIGS. 2A and 2B, a pattern structure may include an anti-reflective coating layer 100, a neutral pattern 120, and a block copolymer pattern 140.

The block copolymer pattern 140 may include a plurality of a first pattern 135 and a second pattern 137. The first patterns 135 may have pillar shapes penetrating the second pattern 137. The second pattern 137 may be covalently bonded to the first patterns 135. As illustrated in FIG. 2A, the first patterns 135 may be spaced apart from each other and may be two-dimensionally arranged when viewed from a plan view.

The neutral pattern 120 may include a plurality of holes HL exposing the anti-reflective coating layer 100. A diameter DM2 of each of the holes HL may be 50% of a length $L_0$ of one block copolymer in the block copolymer pattern 140.

Some portions 135P of the first patterns 135 of the block copolymer pattern 140 may fill the holes HL, respectively. The second pattern 137 and the others 135 of the first patterns 135 may be disposed on the neutral pattern 120. The first patterns 135P filling the holes HL are defined as pinning patterns 135P. A diameter DM2 of each of the first patterns 135 and 135P may be 50% of the length $L_0$ of the one block copolymer in the block copolymer pattern 140. In addition, a portion of the second pattern 137 disposed between the first patterns 135 adjacent to each other in the first direction DR1 may have a width equal to 50% of the length $L_0$ of the one block copolymer in the block copolymer pattern 140.

One of the first and second patterns 135 and 137, respectively, may be removed to form patterns having the width of about 20 nm or less.

Other features of the anti-reflective coating layer 100, the neutral pattern 120, and the block copolymer pattern 140 except their structures described above may be the same as described with reference to FIGS. 1A and 1B.

Figure 3:
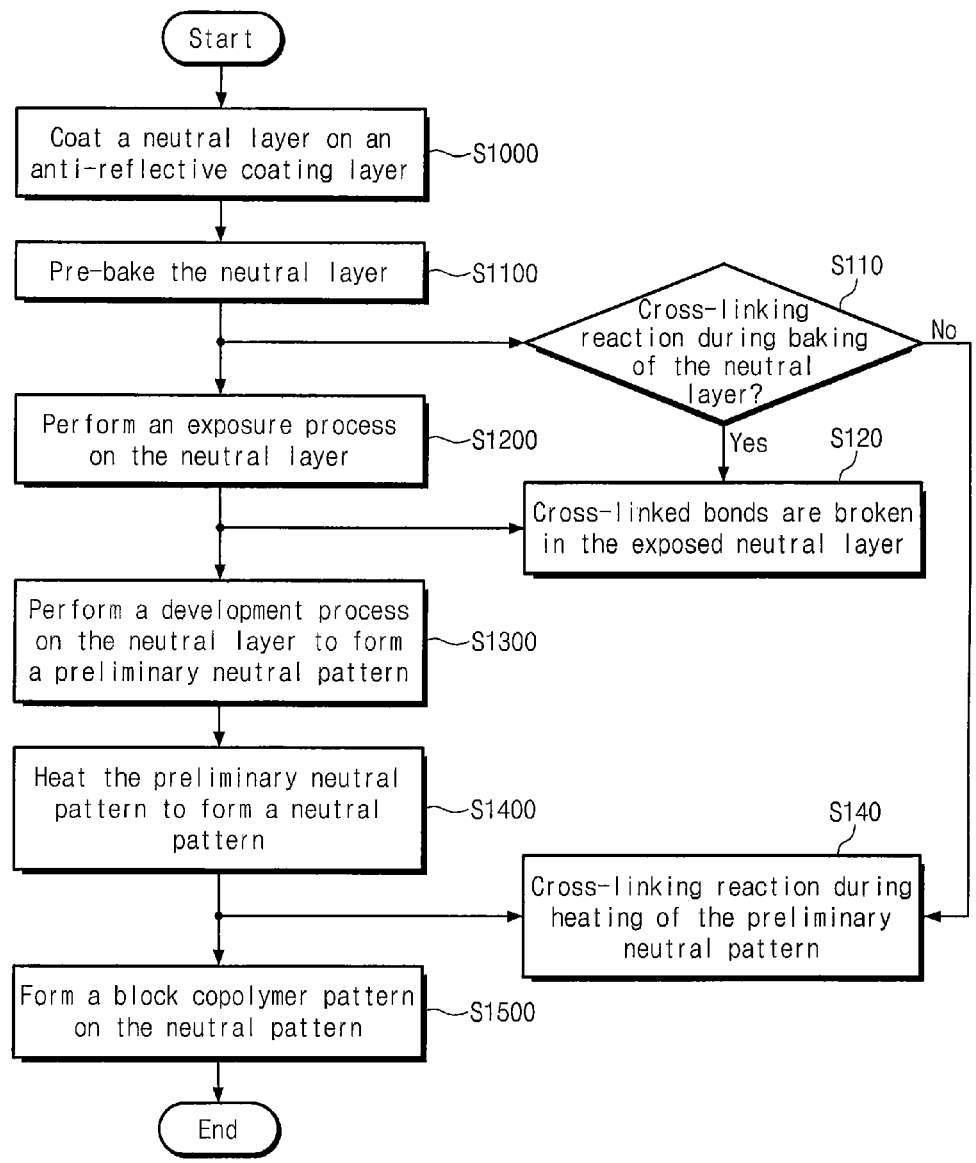
FIG. 3 is a flowchart illustrating a method of manufacturing a semiconductor device according to some embodiments of the inventive concepts.

FIG. 3 is a flowchart illustrating a method of manufacturing a semiconductor device according to some embodiments of the inventive concepts. FIGS. 4A to 4D are plan views illustrating a method of manufacturing a semiconductor device according to some embodiments of the inventive concepts. FIGS. 5A through 5D are cross-sectional views taken along lines I-I' of FIGS. 4A through 4D, respectively.

Figure 4A:
FIGS. 4A through 4D are plan views illustrating a method of manufacturing a semiconductor device according to some embodiments of the inventive concepts.
Figure 5A:
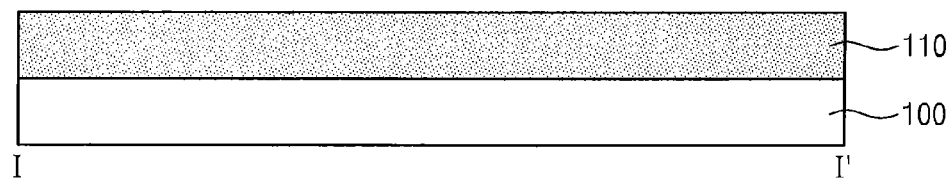
FIGS. 5A through 5D are cross-sectional views taken along lines I-I' of FIGS. 4A through 4D, respectively.

Referring to FIGS. 3, 4A, and 5A, a neutral layer 110 may be formed on an anti-reflective coating layer 100.

Even though not illustrated in more detail in the drawings, the anti-reflective coating layer 100 may be formed on a lower structure, for example, a substrate. The anti-reflective coating layer 100 may be coated on the substrate, and a bake process may be performed on the anti-reflective coating layer 100. In some embodiments, the anti-reflective coating layer 100 may include a material having an affinity for PMMA. The anti-reflective coating layer 100 may include PMMA or a PMMA derivative.

The neutral layer 110 may be coated on the anti-reflective coating layer 100 (S1000). Subsequently, the neutral layer 110 may be pre-baked (S1100). The neutral layer 110 may include a material having a photosensitive property and a reflow property at a high temperature. The reflow property allows the material or polymer to have a flowable characteristic. In some embodiments, the reflow property is present at a temperature that is greater than the glass transition temperature. In some embodiments, the neutral layer 110 may include a polymer resin, a photo acid group (PAG), a cross linker, and a solvent. The polymer resin may include a material formed by randomly mixing PMMA and PS in the range of 1:1. Each of the PMMA and PS may include at least one end group selected from a group consisting of a leaving group, a cross linking site, a hydrophobic group, a hydrophilic group, and combinations thereof. In addition, the neutral layer 110 may further include a thermal acid generator (TAG) and a quencher. These materials of the neutral layer 110 may be the same as described with reference to FIGS. 1A and 1B described previously.

In some embodiments, a cross-linking reaction may occur by the cross linker in the neutral layer 110 during the pre-bake process (S1100) of the neutral layer 110. In other embodiments, the cross-linking reaction does not occur in the neutral layer 110 during the pre-bake process (S1100) of the neutral layer 110. The occurrence of the cross-linking reaction may be determined depending on the amount and a type of cross linker (S110). For example, the pre-bake process may induce the cross-linking reaction between the cross linker and the polymer resin containing the hydroxyl group and/or the carboxyl group to form an acid unstable bridge. In the cross-linking reaction according to an embodiment, the hydroxyl group and/or the carboxyl group of the polymer resin may be cross-linked with a vinyl ether end group of the cross linker to form an acid unstable acetal. The vinyl ether-ended cross linker may be added at a ratio of 0.2 moles to 2.0 moles per a functional group of the polymer resin.

Figure 4B:
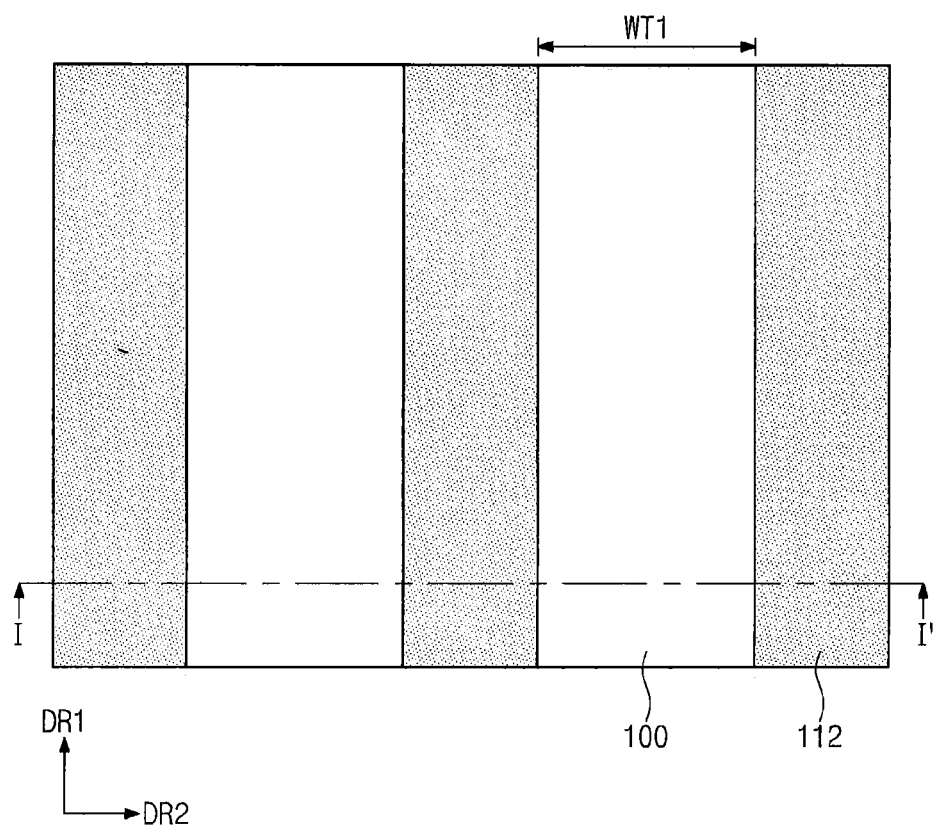
Figure 5B:
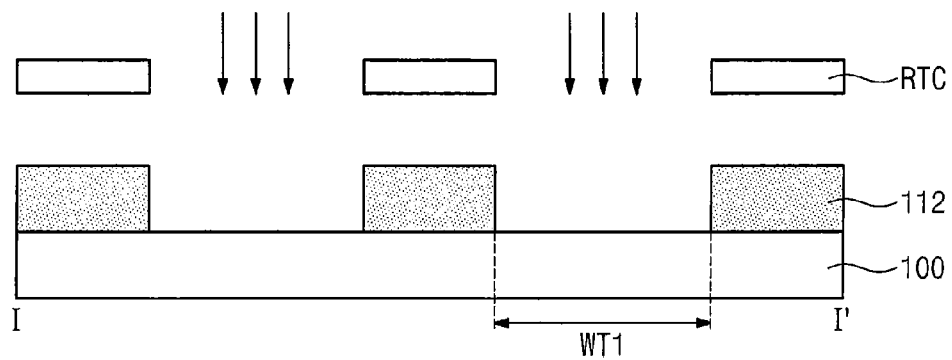

Referring to FIGS. 3, 4B and 5B, an exposure process and a development process may be performed on the neutral layer 110 to form a preliminary neutral pattern 112.

During the exposure process, light generated from a light source may be irradiated to the neutral layer 110 through a reticle RTC (S1200). Examplary light sources may use ArF, ArFi (ArF immersion), or extreme ultraviolet (EUV). In some embodiments, if cross-linked bonds occur in the neutral layer 110, the cross-linked bonds may be broken in the neutral layer 110 during the exposure process (S120).

After the exposure process, the exposed neutral layer 110 may be developed to form the preliminary neutral pattern 112 (S1300). In some embodiments, a portion, in which the cross-linked bonds are broken, of the neutral layer 110 may be removed by the development.

In some embodiments, the preliminary neutral patterns 112 may have linear shapes extending in a first direction DR1 and may be spaced apart from each other in a second direction DR2 perpendicular to the first direction DR1. A distance WT1 between the preliminary neutral patterns 112 adjacent to each other may be n times a length $L_0$ of one block copolymer included in a block copolymer pattern 140 illustrated in FIGS. 4D and 5D, where n is an integer of 2 or more. For example, the distance WT1 may be about 50 nm or less, and a thickness of the preliminary neutral pattern 112 may be in a range of about 20 nm to about 30 nm.

In some embodiments, the preliminary neutral patterns 112 may be completed by a post-bake process performed after the exposure and/or development processes.

Figure 4C:
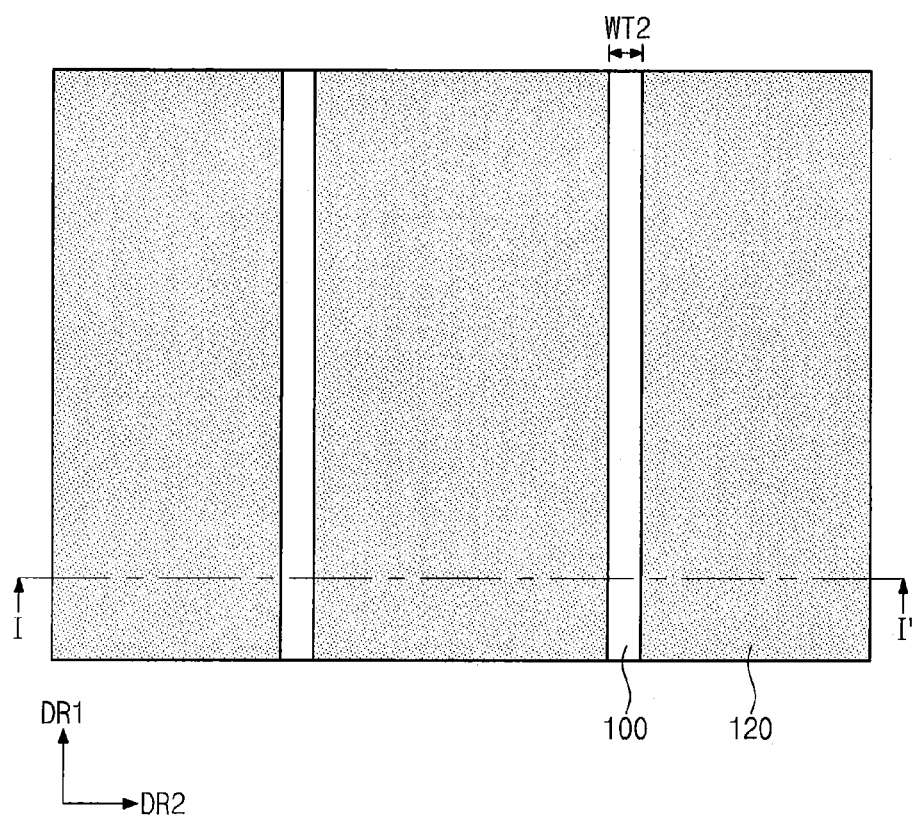
Figure 5C:
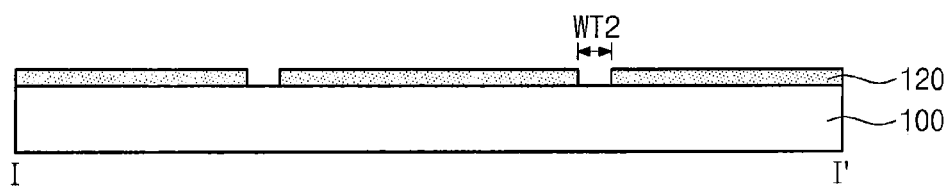

Referring to FIGS. 3, 4C and 5C, the preliminary neutral patterns 112 may be post-baked or heated at higher temperatures of about 150° C. to about 250° C. to form neutral patterns 120 (S1400).

If the preliminary neutral patterns 112 are post-baked at the higher temperatures, the preliminary neutral patterns 112 may be reflowed to form the neutral patterns 120. A width WT2 of the anti-reflective coating layer 100 exposed between the neutral patterns 120 may be 50% of the length $L_0$ of the one block copolymer included in the block copolymer pattern 140 illustrated in FIGS. 4D and 5D. For example, the width WT2 of the exposed anti-reflective coating layer 100 may be about 20 nm or less, and a thickness of the neutral pattern 120 may be about 10 nm or less.

In some embodiments, if the cross-linked bond does not exist in the preliminary neutral pattern 112, the cross-linking reaction may occur in the preliminary neutral patterns 112 at the high temperature (S140).

As described above, since the neutral patterns 120 can be formed without a photoresist pattern, exposure and development processes of a photoresist layer may be omitted to simplify manufacturing processes of a semiconductor device. In addition, the neutral patterns 120 may be formed without other chemical reactions between the photoresist layer and the neutral pattern 120.

Since the reflow and the cross-linking reaction are performed during the post-bake process, the type and content ratio of the cross linker in the neutral patterns 120 and the temperature and a process time of the post-bake process may be optimized to control the degree of the cross-linking reaction and/or the reflow.

Figure 4D:
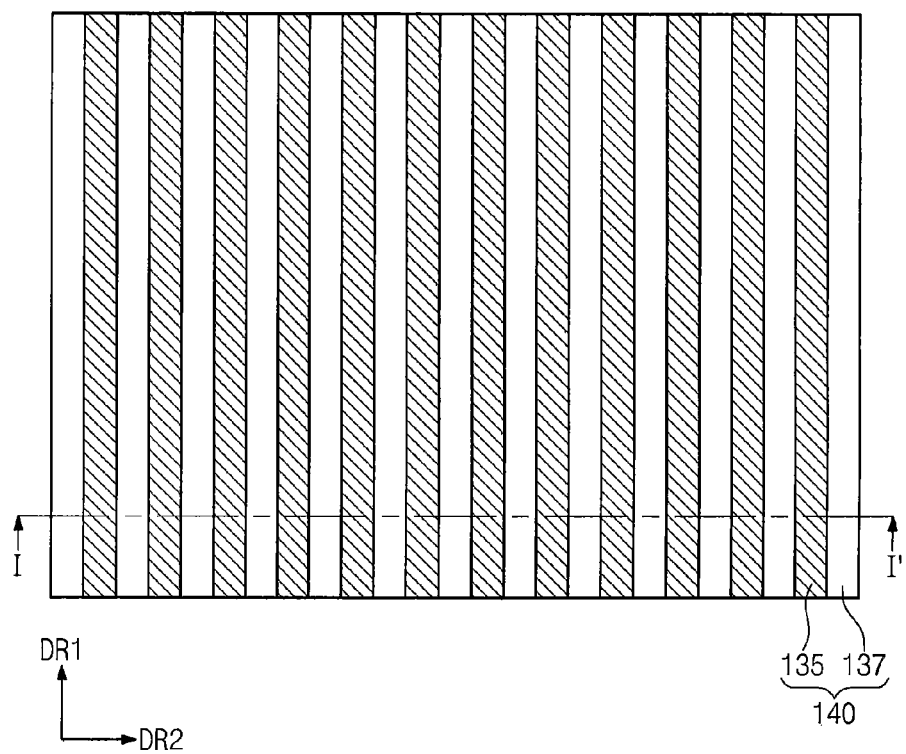
Figure 5D:
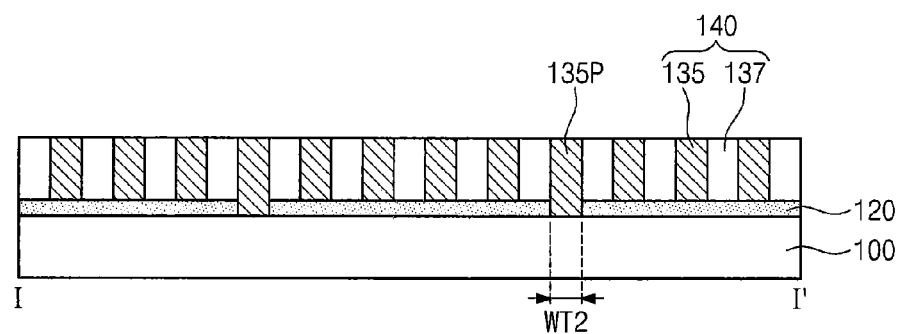

Referring to FIGS. 3, 4D and 5D, a block copolymer layer may be coated on the neutral patterns 120, and then an annealing process may be performed on the block copolymer layer to form a block copolymer pattern 140 (S1500). At this time, a temperature of the annealing process may be in a range of about 150° C. to about 250° C.

In some embodiments, the block copolymer layer may include PMMA-b-PS including PMMA and PS covalently bonded to each other.

The block copolymer layer may be converted into the block copolymer pattern 140 including first patterns 135 and second patterns 137. The first pattern 135 includes PMMA, and the second pattern 137 includes PS. At least one 135P of the first patterns 135 may be formed on the anti-reflective coating layer 100 exposed between the neural patterns 120. Others of the first patterns 135 and the second patterns 137 may be formed on the neutral patterns 120.

As a result, patterns for a line-and-space structure may be completed by the first and second patterns 135 and 137.

Figure 6A:
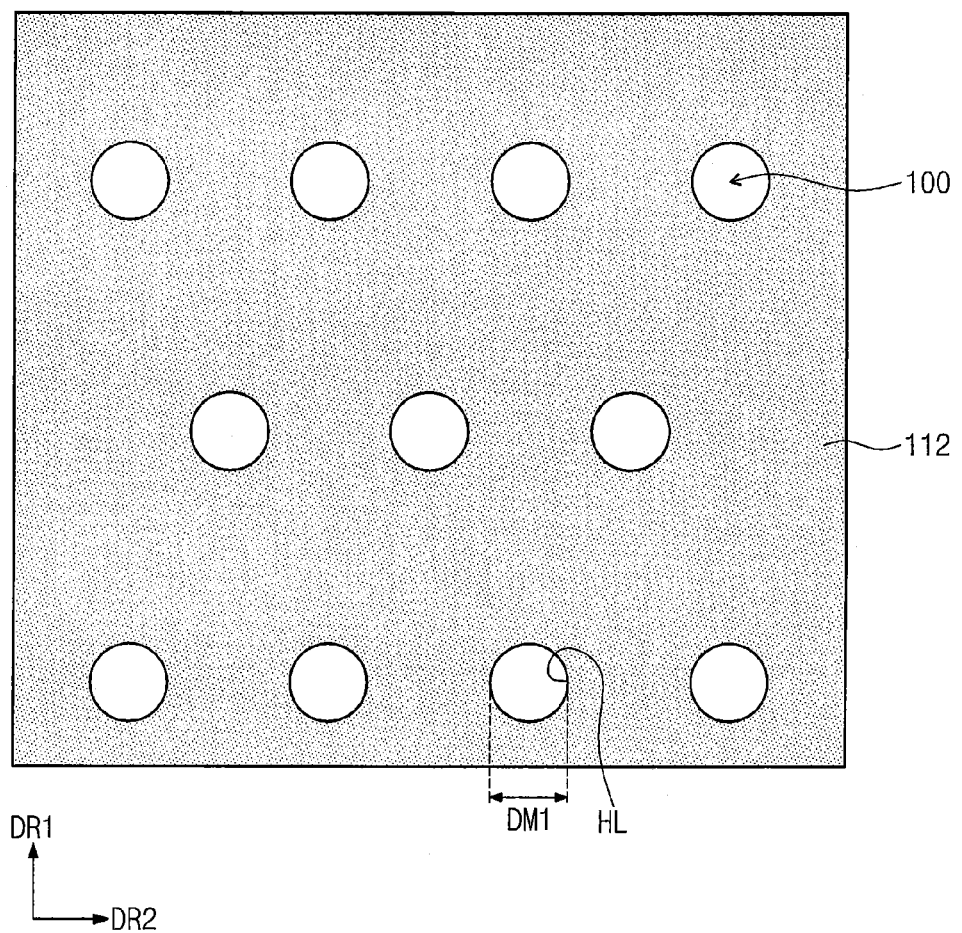
FIGS. 6A through 6C are plan views illustrating a method of manufacturing a semiconductor device according to other embodiments of the inventive concepts.
Figure 6B:
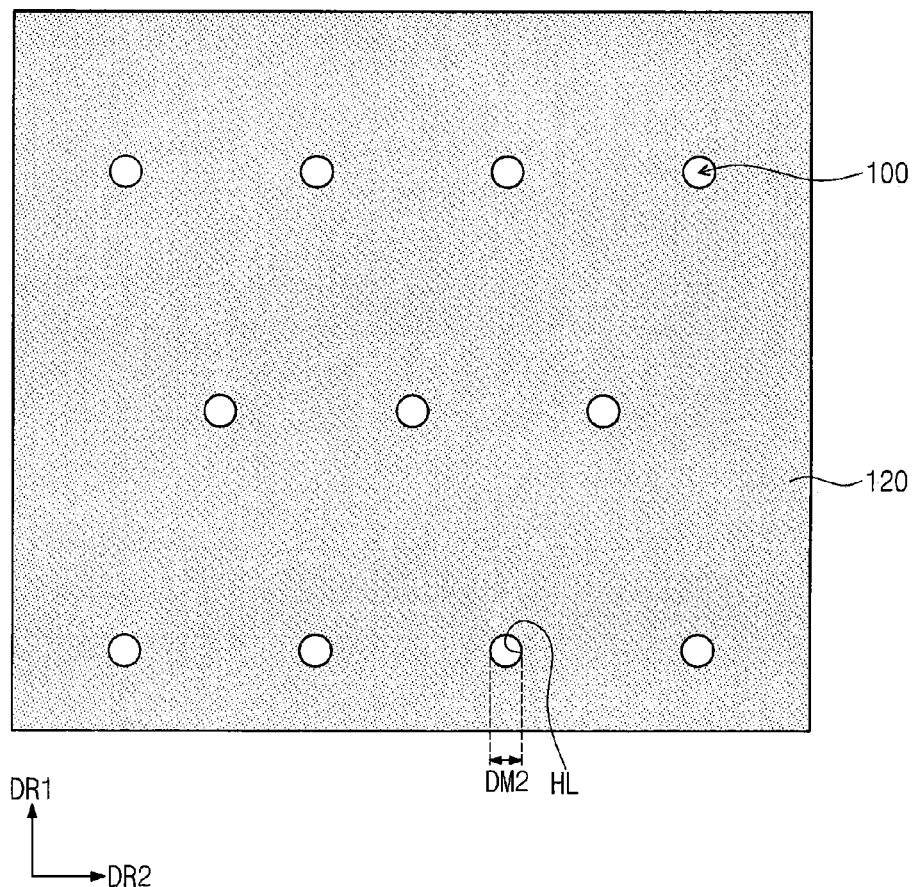
Figure 6C:
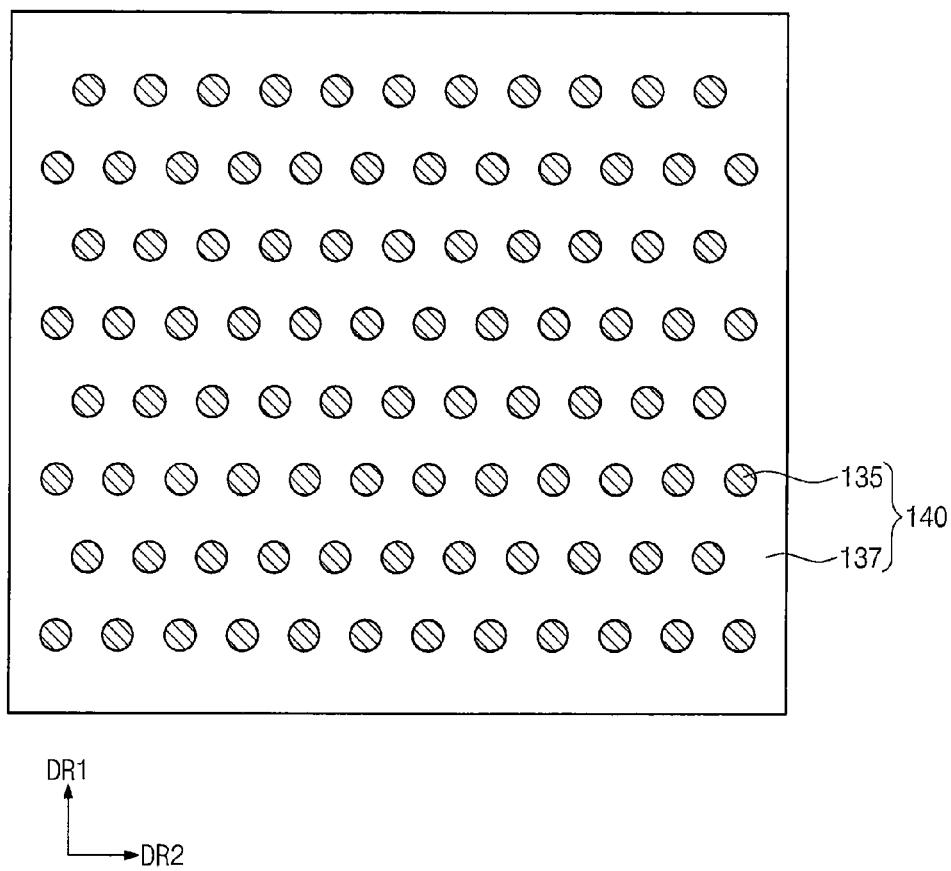

FIGS. 6A through 6C are plan views illustrating a method of manufacturing a semiconductor device according to other embodiments of the inventive concepts.

Referring to FIG. 6A, a neutral layer (not shown) may be formed on an anti-reflective coating layer 110, and exposure and development processes may be then performed to form a preliminary neutral pattern 112.

The process of forming the neutral layer on the anti-reflective coating layer 110 may be the same as described with reference to FIGS. 3, 4A and 5A.

The preliminary neutral pattern 112 may include a plurality of holes HL. A diameter DM1 of each of the holes HL may be n times a length $L_0$ of one block copolymer included in a block copolymer pattern 140 illustrated in FIG. 6C, where n is an integer of 2 or more. For example, the diameter DM1 of the hole HL may be about 50 nm or less, and a thickness of the preliminary neutral pattern 112 may be in a range of about 20 nm to about 30 nm.

The exposure and development process in the present embodiment may be the same as described with reference to FIGS. 3, 4B and 5B.

Referring to FIG. 6B, the preliminary neutral pattern 112 may be post-baked at a high temperature of about 150° C. to about 250° C. to form a neutral pattern 120.

The preliminary neutral pattern 112 may be reflowed by the high-temperature post-bake process to form the neutral pattern 120. In some embodiments, a cross-linking reaction may occur in the preliminary neutral pattern 112 during the post-bake process.

In some embodiments, a diameter DM2 of a hole HL of the neutral pattern 120 may be 50% of the length $L_0$ of the one block copolymer included in the block copolymer pattern 140 illustrated in FIG. 6C. For example, the diameter DM2 of the hole HL may be about 20 nm or less, and a thickness of the neutral pattern 120 may be about 10 nm or less.

Referring to FIG. 6C, a block copolymer layer (not shown) may be coated on the neutral pattern 120 and an annealing process may be performed to form a block copolymer pattern 140.

In some embodiments, the block copolymer layer may include PMMA-b-PS including PMMA and PS covalently bonded to each other.

The block copolymer layer may be converted into the copolymer pattern 140 including first patterns 135 including PMMA and a second pattern 137 including PS by the annealing process. Some portion 135P of the first patterns 135 may be formed to fill the holes HL of the neutral pattern 120. Others of the first patterns 135 and the second pattern 137 may be formed on the neutral pattern 120.

As a result, patterns for a structure including contact holes may be completed by the first and second patterns 135 and 137, respectively.

Figure 7A:
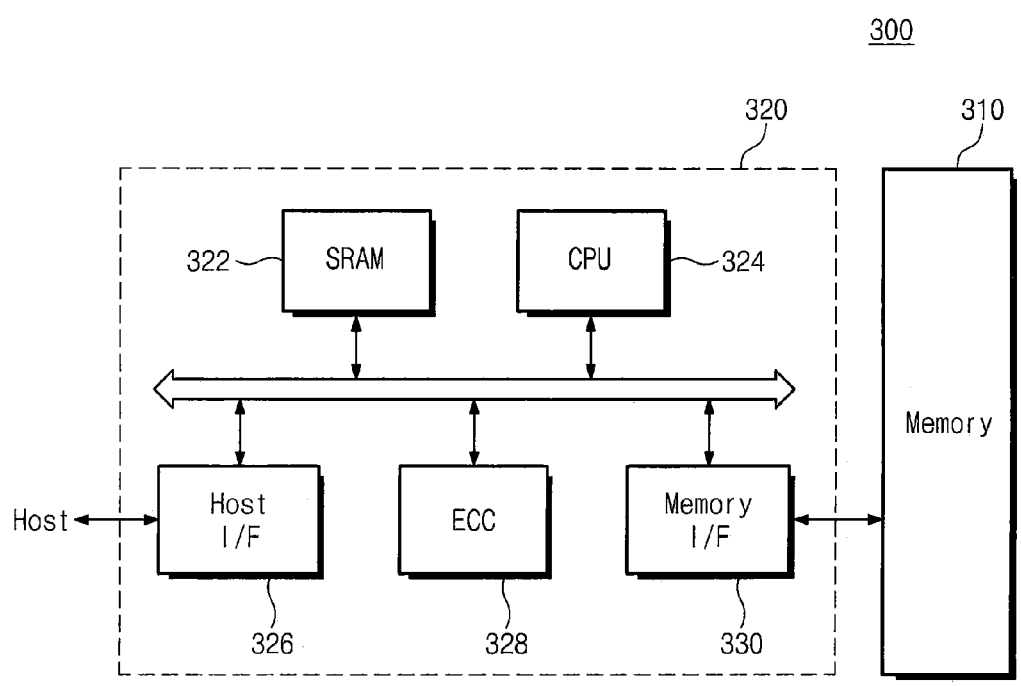
FIG. 7A is a schematic block diagram illustrating a memory card including a semiconductor device according to embodiments of the inventive concepts.

FIG. 7A is a schematic block diagram illustrating a memory card including a semiconductor device according to embodiments of the inventive concepts.

Referring to FIG. 7A, the semiconductor devices according to embodiments of the inventive concepts may be applied to a memory card 300. For example, the memory card 300 may include a memory controller 320 that controls data communication between a host and a memory device 310. A static random access memory (SRAM) device 322 may be used as a working memory of a central processing unit (CPU) 324. A host interface (I/F) unit 326 may be configured to include a data communication protocol between the memory card 300 and the host. An error check and correction (ECC) block 328 may detect and correct errors of data which are read out from the memory device 310. A memory interface unit 330 may interface with the memory device 310. The CPU 324 controls overall operations of the memory controller 320.

Figure 7B:
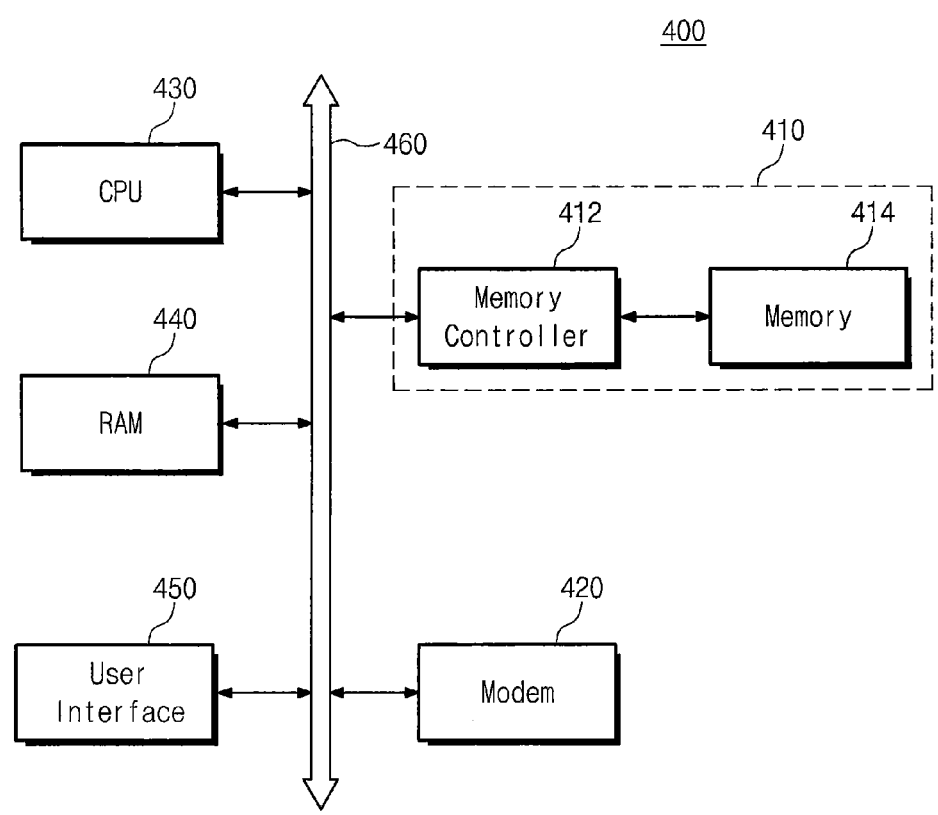
FIG. 7B is a schematic block diagram illustrating an information processing system including a semiconductor device according to embodiments of the inventive concepts.

FIG. 7B is a schematic block diagram illustrating an information processing system including a semiconductor device according to embodiments of the inventive concepts.

Referring to FIG. 7B, an information processing system 400 may include at least one of the semiconductor devices according to the embodiments described above. The information processing system 400 may include a mobile device or a computer. For example, the information processing system 400 may include a modem 420, a central processing unit (CPU) 430, a random access memory (RAM) device 440, and a user interface unit 450 which are electrically connected to a memory system 410 through a system bus 460. The memory system 410 may store data processed by the CPU 430 or data inputted from an external system. The memory system 410 may include a memory device 414 and a memory controller 412. The memory system 410 may have substantially the same structure as the memory card 300 described with reference to FIG. 7A. The information processing system 400 may be realized as a memory card, a solid state disk (SSD) device, a camera image sensor, and another type of application chipset as understood by one of skill in the art. For example, if the memory system 410 may be realized as the SSD device, the information processing system 400 may stably and/or reliably store massive data.

According to embodiments of the inventive concepts, the neutral layer having the photosensitive and reflow properties may be patterned without formation of a photoresist layer, and thus, finer patterns may be formed. In addition, exposure and development processes of the photoresist layer may be omitted to simplify the manufacturing processes of the semiconductor device. Moreover, the finer patterns may be formed without other chemical reactions which may occur between the neutral layer and the photoresist layer.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
   forming a neutral layer on an anti-reflective coating layer, the neutral layer having a photosensitive property and a reflow property;
   performing an exposure process and a development process on the neutral layer to form a preliminary neutral pattern having a first opening, wherein the first opening exposes the anti-reflective coating layer and has a first width;
   heating the preliminary neutral pattern to form a neutral pattern having a second opening, wherein the second opening exposes the anti-reflective coating layer and has a second width;
   forming a block copolymer layer on the neutral pattern; and
   heating the block copolymer layer to form a block copolymer pattern comprising: a first pattern disposed in the second opening of the neutral pattern; and a second pattern disposed on the neutral pattern and chemically bonded to the first pattern;
   wherein the second width is less than the first width.

2. The method of claim 1, wherein the first width of the anti-reflective coating layer exposed by the preliminary neutral pattern is n times a length of one block copolymer included in the block copolymer layer, where n is an integer of 2 or more.

3. The method of claim 2, wherein the second width of the anti-reflective coating layer exposed by the neutral pattern is about 50% of a length of one block copolymer included in the block copolymer pattern.

4. The method of claim 1, wherein a light source of the exposure process uses ArF, ArF immersion (ArFi), or extreme ultraviolet (EUV).

5. The method of claim 1, wherein the second pattern disposed on the neutral pattern is covalently bonded to the first patter.

6. The method of claim 1, wherein forming the neutral layer comprises:
   coating a neutral layer including a cross linker; and baking the neutral layer,
wherein cross-linked bonds are formed in the neutral layer when the neutral layer is baked,
wherein the cross-linked bonds are broken in a portion of the neutral layer and exposed during the exposure process, and
wherein the portion of the neutral layer having the broken cross-linked bonds is removed during the development process.

7. The method of claim 1, wherein cross-linked bonds are formed in the preliminary neutral pattern while the preliminary neutral pattern is heated.

8. The method of claim 1, wherein the neutral layer comprises: polystyrene (PS); polymethylmethacrylate (PMMA); a solvent; a photo acid generator (PAG); and a cross linker.

9. The method of claim 8, wherein each of the polystyrene (PS) moieties and polymethylmethacrylate (PMMA) moieties comprises at least one end group selected from a group consisting of a leaving group, a cross-linking site, a hydrophobic group, a hydrophilic group, and combinations thereof.

10. The method of claim 1, wherein the neutral pattern comprises a plurality of neutral patterns having linear shapes extending in a first direction, and
wherein the plurality of neutral patterns are spaced apart from each other in a second direction perpendicular to the first direction.

11. The method of claim 1, wherein the neutral pattern comprises a plurality of holes exposing the anti-reflective coating layer.

12. The method of claim 1, wherein the first pattern includes polymethylmethacrylate (PMMA), wherein the second pattern includes polystyrene (PS), and wherein the anti-reflective coating layer includes at least one of silicon (Si), titanium (Ti), zirconium (Zr), or tungsten (W).

13. The method of claim 12, wherein the neutral pattern includes PMMA and PS randomly mixed with each other.

14. The method of claim 12, wherein the block copolymer pattern further comprises a third pattern disposed on the neutral pattern and including the PMMA; and a fourth pattern disposed on the neutral pattern and including the PS, wherein the fourth pattern is chemically bonded to the third pattern, and wherein the third and fourth patterns are alternately formed.

15. The method of claim 14, wherein the fourth pattern is covalently bonded to the third pattern.

16. A method of manufacturing a semiconductor device, the method comprising:
forming a neutral layer on an anti-reflective coating layer, the neutral layer comprising polystyrene (PS); polymethylmethacrylate (PMMA); a solvent; a photo acid generator (PAG); and a cross linker, and having a photosensitive property and a reflow property;
performing an exposure process and a development process on the neutral layer to form a preliminary neutral pattern at least partially exposing the anti-reflective coating layer;
reflowing the preliminary neutral pattern to form a neutral pattern, wherein the neutral pattern comprises a plurality of neutral patterns having linear shapes extending in a first direction, and wherein the plurality of neutral patterns are spaced apart from each other in a second direction perpendicular to the first direction;
forming a block copolymer layer on the neutral pattern; and
heating the block copolymer layer to form a block copolymer pattern comprising: a first pattern disposed on the anti-reflective coating layer exposed by the neutral pattern; and a second pattern disposed on the neutral pattern and chemically bonded to the first pattern,
wherein a first width of the anti-reflective coating layer exposed by the neutral pattern is less than a second width of the anti-reflective coating layer exposed by the preliminary neutral pattern.

17. A method of forming a pattern structure comprising:
forming a neutral layer on an anti-reflective coating layer, the neutral layer having a photosensitive property and a reflow property;
performing an exposure process and a development process on the neutral layer to form a preliminary neutral pattern at least partially exposing the anti-reflective coating layer;
heating the preliminary neutral pattern to form a neutral pattern;
forming a block copolymer layer on the neutral pattern; and
heating the block copolymer layer to form a block copolymer pattern comprising: a first pattern disposed on the anti-reflective coating layer exposed by the neutral pattern; and a second pattern disposed on the neutral pattern and chemically bonded to the first pattern,
wherein a first width of the anti-reflective coating layer exposed by the neutral pattern is less than a second width of the anti-reflective coating layer exposed by the preliminary neutral pattern.

18. The method of claim 17, wherein forming the neutral layer comprises coating a neutral layer including a cross linker; and baking the neutral layer, wherein cross-linked bonds are formed in the neutral layer when the neutral layer is baked, wherein the cross-linked bonds are broken in a portion of the neutral layer and exposed during the exposure process, and wherein the portion of the neutral layer having the broken cross-linked bonds is removed during the development process.

19. The method of claim 17, wherein the first pattern includes polymethylmethacrylate (PMMA), wherein the second pattern includes polystyrene (PS), and wherein the anti-reflective coating layer includes at least one of silicon (Si), titanium (Ti), zirconium (Zr), or tungsten (W).

20. The method of claim 17, wherein the block copolymer pattern further comprises a third pattern disposed on the neutral pattern and including the PMMA; and a fourth pattern disposed on the neutral pattern and including the PS, wherein the fourth pattern is chemically bonded to the third pattern, and wherein the third and fourth patterns are alternately formed.

* * * * *